(12) United States Patent
Manna et al.

(10) Patent No.: US 7,064,358 B2
(45) Date of Patent: Jun. 20, 2006

(54) TRIGGERED BACK-TO-BACK DIODES FOR ESD PROTECTION IN TRIPLE-WELL CMOS PROCESS

(75) Inventors: Indrajlt Manna, Singapore (SG); Keng Foo Lo, Singapore (SG); Pee Ya Tan, Singapore (SG); Raymond Filippi, Singapore (SG)

(73) Assignee: Chartered SemiConductor Manufacturing, LTD, Singapore (SG)

( * ) Notice: Subject to any disclaimer, the term of this patent is extended or adjusted under 35 U.S.C. 154(b) by 191 days.

(21) Appl. No.: 10/743,596

(22) Filed: Dec. 22, 2003

(65) Prior Publication Data

US 2005/0133870 A1    Jun. 23, 2005

(51) Int. Cl.
    *H01L 29/72*    (2006.01)
(52) U.S. Cl. .................... 257/173; 438/133
(58) Field of Classification Search ............... 257/173, 257/111; 438/133, 139, 328
    See application file for complete search history.

(56) References Cited

U.S. PATENT DOCUMENTS

| | | |
|---|---|---|
| 5,903,419 A | 5/1999 | Smith |
| 6,537,868 B1 | 3/2003 | Yu |
| 6,555,878 B1 | 4/2003 | Song |
| 6,563,175 B1 | 5/2003 | Shiau et al. |
| 6,611,028 B1 | 8/2003 | Cheng |
| 6,617,650 B1 | 9/2003 | Chen |
| 6,621,133 B1 | 9/2003 | Chen |
| 6,707,109 B1 * | 3/2004 | Hayashida .......... 257/355 |
| 2002/0122280 A1 | 9/2002 | Ker |

* cited by examiner

*Primary Examiner*—Douglas W. Owens
(74) *Attorney, Agent, or Firm*—William J. Stoffel

(57) ABSTRACT

An embodiment is a Electro Static Discharge (ESD) protection device comprising: a n-doped region and a p-doped region in a p-well in a semiconductor structure. The n-doped region and the p-doped region are spaced. A n-well and a deep n-well surrounding the p-well on the sides and bottom. A first I/O pad connected to the n-doped region. A trigger circuit connected the first I/O pad and the p-doped region. A second I/O pad connected to the n-well. A parasitic bipolar transistor is comprised of the n-doped region that functions as a collector terminal, the P-well that functions as a base terminal, and the deep N-well that functions as the emitter terminal. Whereby under an ESD condition, the p-well is charged positive using the trigger circuit and the parasitic bipolar transistor can be turned on.

33 Claims, 6 Drawing Sheets

TRIGGERED BACK-TO-BACK DIODES FOR ESD PROTECTION IN TRIPLE-WELL CMOS PROCESS

BACKGROUND OF INVENTION

1) Field of the Invention

This invention relates generally to Electro Static Discharge (ESD) devices and methods thereof and more particularly to an electrostatic discharge method and device comprising a parasitic bipolar transistor and a deep well.

2) Description of the Prior Art

In the semiconductor industry, the use of electrostatic discharge protection (ESD) devices is known. ESD circuits ensure that integrated semiconductor devices are not destroyed by static electricity during routine post-manufacture processes. However, current and foreseeable trends in the semiconductor industry are adversely impacting the effectiveness of known ESD circuits.

Designing ESD protection structures for high-speed analog and RF application is a challenge due to stringent requirement of input impedance and area. Various techniques have been invented for extending the traditional ESD protection device in RF area. Most involve some form of diode protection as diodes are very robust in carrying ESD current in forward bias. The diode solution works fine except for the series resistance which results in voltage drop in the forward conduction mode. In addition, current density of forward biased diode is limited by the current crowding of the junction. Typically reported values are in the range of 10–30 mA/um-square. If a polysilicon bounded diode is used the maximum current before destructive breakdown is limited by the local breakdown of gate oxide which is weakened by the thermal heating in the diode during ESD current conduction. Thus, maximum possible current density is sometimes never reached in polysilicon bounded diode. Simple salicide-blocked polysilicon diode is sometime used for RF ESD protection but the issue is high standby leakage through polysilicon grain boundaries. Also poly pre-dope has to be blocked in the diode area to be able to form P+/N+ junction.

The more relevant patents are US 2002/0122280A1(Ker et al.) shows a SCR device with deep-n-well structure for ESD.

U.S. Pat. No. 6,617,650b1 (Chen et al.) shows a ESD device with a buried n-well.

U.S. Pat. No. 5,903,419 (Smith) show an ESD circuit with a string of diodes.

U.S. Pat. No. 6,621,133B1 (Chen et al.) shows a ESD device comprised of a chain of parasitic BJTs.

U.S. Pat. No. 6,555,878B2 (Song et al.) shows a UMOS-like gate controlled Thyristor structure for ESD.

U.S. Pat. No. 6,611,028B2 (Cheng et al.) shows a substrate coupled ESD device.

U.S. Pat. No. 6,537,868b1 (Yu) shows a leakage current cascaded Diode structure.

U.S. Pat. No. 6,563,175B2 (Shiau et al.) shows a NMOS ESD device with silicide.

However, there is a need for an improved ESD devices and methods.

SUMMARY OF THE INVENTION

It is an object of an embodiment of the invention to provide a ESD device and method for fabricating the ESD device that uses a deep well as an element in a parasitic bipolar Transistor.

An embodiment of the present invention provides an ESD device which is characterized:

a n-doped region and a p-doped region in a p-well in a semiconductor structure; the n-doped region and a p-doped region are spaced;

a n-well and a deep n-well surrounding the p-well on the sides and bottom;

a first I/O pad connected to the n-doped region;

a trigger circuit connected the first I/O pad and the p-doped region;

a second I/O pad connected to the n-well;

a parasitic bipolar transistor is comprised of the n-doped region functioning as a collector terminal, the P– well functioning as a base terminal, and the deep p-well functioning as the emitter terminal; whereby under an ESD condition, the p-well is charged positive using the trigger circuit and the parasitic bipolar transistor can be turned on.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

For purposes of more clearly illustrating the invention, the discussion is structured according the following headings. No particular limitation should be accorded to any heading or classification.

Introduction

Figure 7:
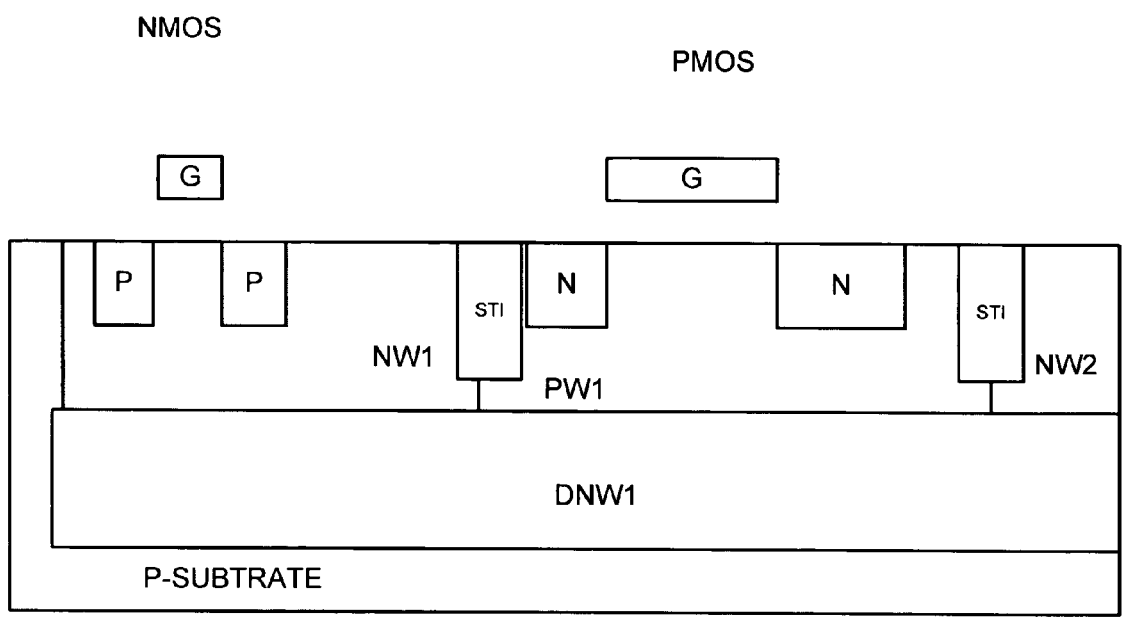
FIG. 7 shows an example of a triple well structure according to the prior art.

With availability of triple well option in advanced mixed signal/analog process, more options have become available to ESD device designers as deep p-well has become available to use for ESD device. FIG. 7 shows an example of a triple well structure according to the prior art.

Potential in the P− well enclosed by deep p-well can be independently controlled. This property enables design of new kind of ESD devices.

The structure in which one well region (p well PW1, in the example in FIG. 1A) and the substrate 10 (e.g., p-doped substrate ) are thus isolated from each other is usually referred to as triple well structure. The formation of the triple well structure facilitates the electric isolation between the substrate region of the NMOS transistor and the substrate 10. The substrate 10 is preferably connected to a ground line VSS (0 V) through a diffusion region (p+ layer) into which p-type impurities are implanted.

Figure 1A:
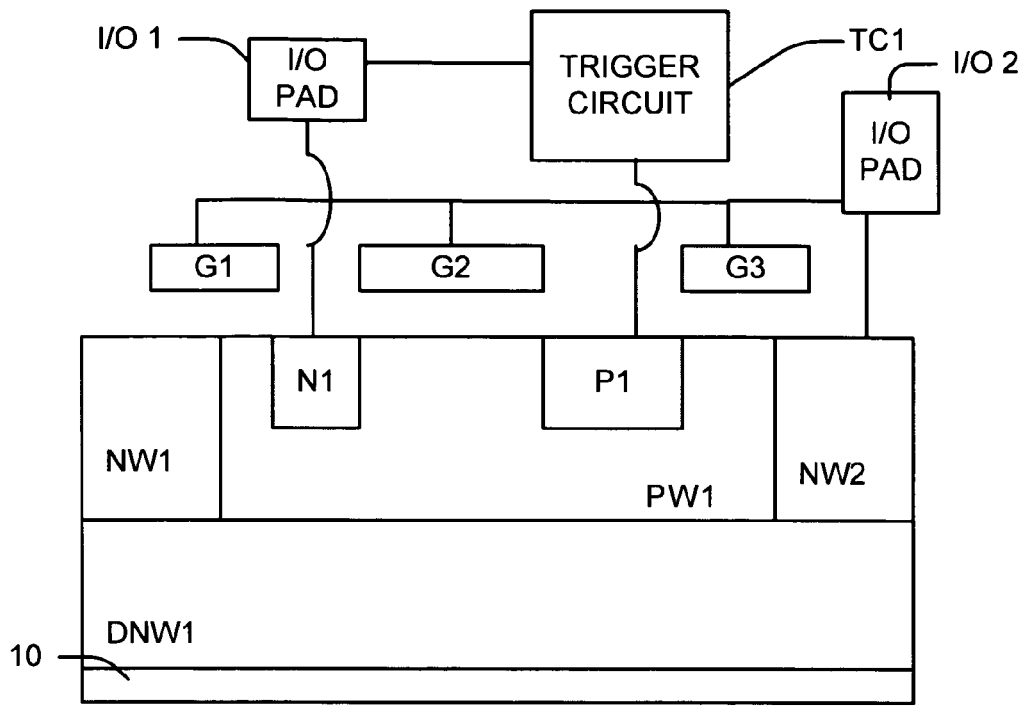
FIGS. 1A and 1B are cross sectional views of a ESD device according to an embodiment of the invention.
Figure 1B:
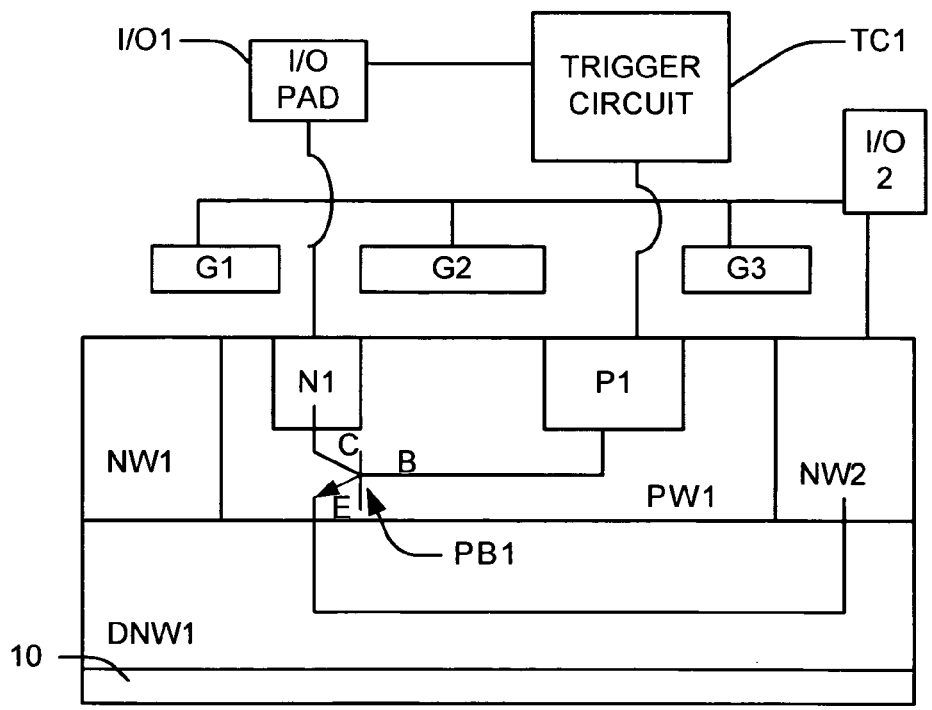

Embodiments of the invention are designed to get around some of the problems that diode-based ESD designs present. An embodiment under non-ESD conditions, has two "back to back" diodes. For example, the embodiment shown in FIGS. 1A and 1B, use a deep N-well (DNW1) and P-well (PW1) as two terminals of a first diode; and a N+doped region (N1) and the floating P-well (PW1) as two terminals of the second diode. FIG. 1A is a cross sectional view of a first embodiment. FIG. 1B is a cross sectional view of the embodiment in FIG. 1A with the parasitic transistor PB1 drawn in. Due to back to back nature of the first and second diodes, leakage current is much smaller when the device is not triggered (P-well is grounded) but can be easily turned on by dumping charge into the P-well and bipolar action can be initiated.

Under ESD condition, P-well is charged positive using a trigger circuit and parasitic bipolar (PB1) comprised of N+region (N1), P-well (PW1) and deep N-well (DNW1) can be turned on.

An embodiment of the ESD device is comprised of a N+ junction in P− well enclosed by a deep N-well. N+ junction is connected to the first I/O pad and deep N-well is connected to a second I/O pad. The P-well is grounded under normal operation making back-to-back diode impossible to turn on and offer good leakage behavior.

Under ESD condition, P-well is charged positive using a trigger circuit and parasitic bipolar consisting of N+, P− well and deep p-well can be turned on. Poly gate is used to prevent ST1 formation, to improve current distribution during ESD to improve ESD device turn-on during as ESD event. The device will work without poly gates but performance (current carrying capacity in an ESD event) may be inferior to the option with poly gate.

First Example Embodiment of ESD Protection Device

Referring to FIGS. 1A and 1B, a first example embodiment of ESD protection device is shown. FIG. 1B shows a representation of the a parasitic bipolar transistor (PB1). The example shows a first N doped region (N1), a p-well (PW1) and deep n-well (DNW1). But, the opposite conductivity type structure can be formed.

A substrate structure 10 is provided. The semiconductor structure can be comprised of silicon (Si). The top surface of the substrate structure 10 is preferably a p minus doped silicon layer, such as the top portion of a p type silicon wafer.

A n-doped region (N1) and a p-doped region (P1) are in a p-well (PW1) in a semiconductor structure 10. The n-doped region (N1) and a p-doped region (P1) are preferably spaced apart.

The n-doped region (N1) and a p-doped region (P1) are preferably spaced by the p-well (PW1).

The n-doped region (N1) and a p-doped region (P1) could be spaced by isolation region (e.g., STI) between the n-doped region and p-doped region, but this may not be optimal.

The N doped region and p-doped region can be formed in the same steps and the source and drain regions of NMOS and PMOS devices simultaneously formed on the chip.

A n-well (NW1 NW2) surrounds the p-well (PW1) on the sides. A deep n-well (DNW1) surrounds the p-well (PW1) bottom.

Figure 1C:
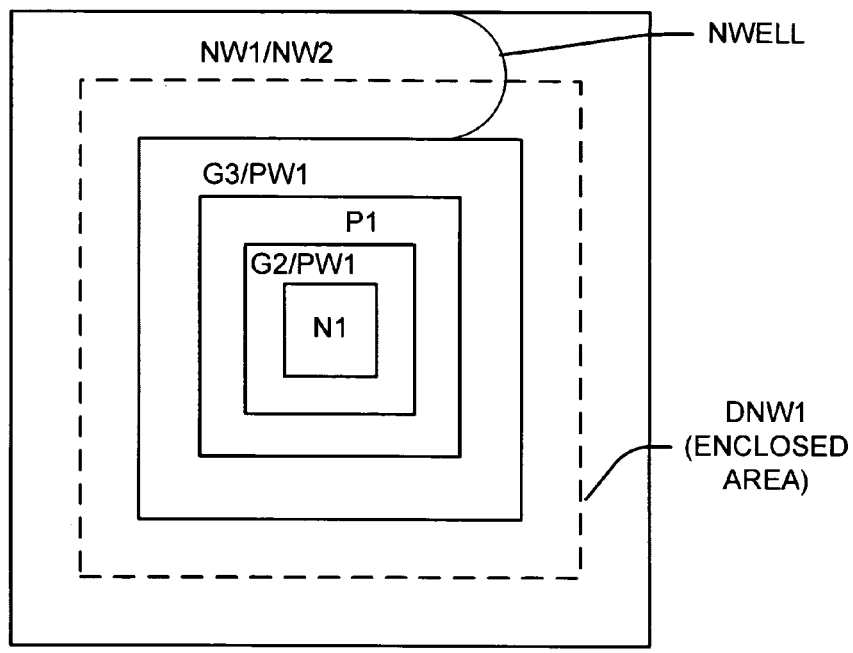
FIG. 1C is a top down view of an aspect of the first embodiment.

As shown in FIGS. 1A and 1C, the n-well (NW1 NW2) are around the sides of the p-well (PW1). The n-well can be comprised of one or more n-wells. For example the n-well (NW1 NW2) can be one n-well or two n-wells. The deep n-well (DNW1) is under the p-well (PW1) and n-well (NW1 NW2).

A first I/O pad (first input-output pad) (I/O1) is connected to the n-doped region (N1). The I/O pad is connected to the trigger circuit (TC1).

A second I/O pad (I/O2) is connected to the n-well (NW2). The second I/O pad is preferably connected to the gates (G1, G2 G3).

Contacts to the regions, e.g., n-doped and said p-doped regions, are preferably comprised of a silicide.

A trigger circuit (TC1) is connected the I/O pad (IN1) and the p-doped region (P1).

The trigger device has two terminals in which the one terminal is connected to the p-doped region (P1) via wiring and in which the other terminal is connected to a reference voltage terminal (such as the I/O pad), for allowing electric current to flow when a voltage higher than a predetermined value is applied between the two terminals.

At this point, it is appropriate to note that the ESD circuit uses the trigger circuit to trigger a parasitic bipolar transistor (PB1) that shunts excess energy. The use of a trigger current lowers the point at which the parasitic bipolar transistor begins to shunt energy. The use of a parasitic bipolar transistor eliminates the need for a true bipolar device. A true bipolar transistor is one who's control electrode is separate from the semiconductor substrate and, hence, is directly controllable. Typically, the inclusion of a bipolar device significantly increases the manufacturing costs of the integrated circuit. The direct application of the trigger current to the control electrode (e.g., P1) of the parasitic bipolar transistor locally overcomes the voltage potential caused by a heavily doped well or substrate.

The contacts to the doped regions are preferably comprised of a silicide.

FIG. 1C shows a top down view of an aspect of the first embodiment (See FIGS. 1A and 1B). The first gate (G1) is not shown as P1 completely surround N1 in this example layout. Also, the trigger circuit is not shown.

Operation of the ESD Device—Parasitic Bipolar Transistor (PB1)

Referring to FIG. 1B, a (vertical) parasitic bipolar transistor (PB1) is comprised of the n-doped region (N1) functioning as a collector terminal, the P− well (PW1) functioning as a base terminal, and the deep p-well (DNW1) functioning as the emitter terminal.

Normal Conditions

The P− well is grounded under normal operation making back-to-back diode difficult (to impossible) to turn on and offer good leakage behavior.

ESD Condition

Under an ESD condition, the p-well (PW1) is charged positive using the trigger circuit (TC1) and the parasitic bipolar transistor (PB1) can be turned on. An ESD condition can be a positive voltage to the I/O pad.

Normally, the deep well is coupled to the lesser of two voltage supplies, such the Vdd or ground (i.e., ESD device operates in one direction). The trigger point is easily programmable by changing the trigger circuit, such as by increasing or decreasing the number of diodes in a diode string. However, it is the parasitic bipolar device that shunts the majority of the excess energy, not the diode string. Consequently, the individual diodes may be made very small to minimize current leakage and temperature induced performance variations.

Also, the ESD device uses the deep well as a emitter element in the parasitic transistor. Therefore, ESD device may be incorporated triple well designs of integrated circuits. One skilled in the art will readily appreciate the suitability of ESD circuit to current and future integrated circuit process flows.

The parasitic bipolar Tx operates as follows. When the base (PW1) is shorted to NW2 through trigger circuit, no base-emitter voltage exists and bipolar doesn't turn on. Under ESD conditions, trigger circuit biases the base positive with respect to emitter (DNW1) and the parasitic bipolar Tx trues on and shunt ESD current.

Figure 1D:
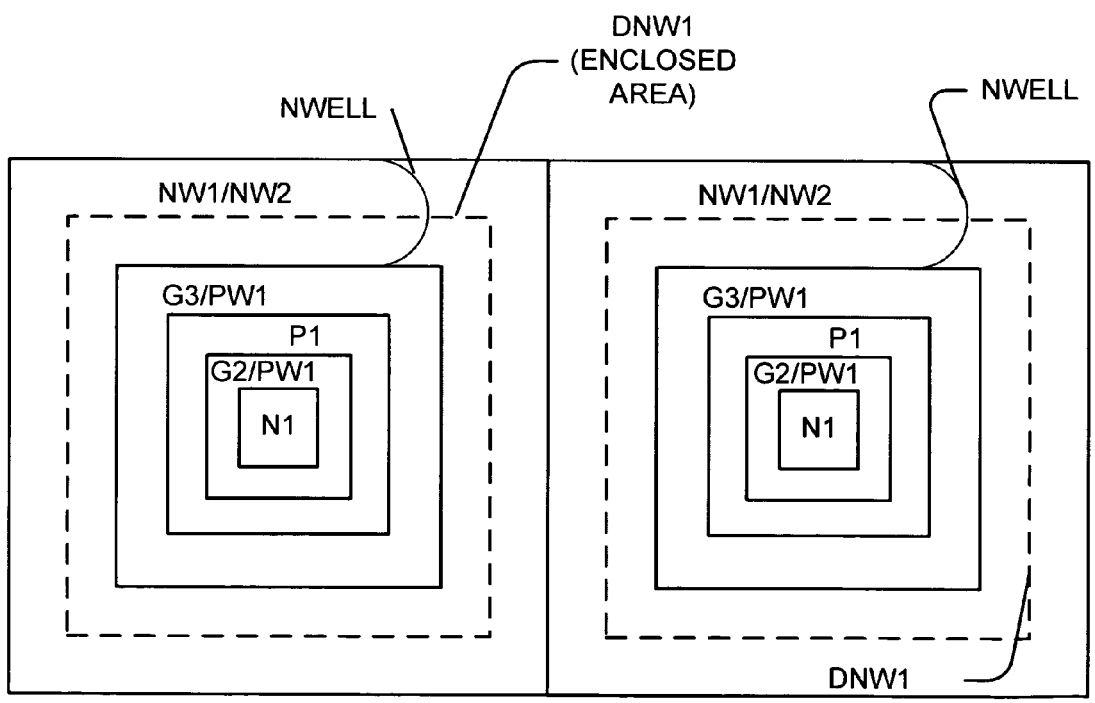
FIG. 1D is top down view of an aspect of an embodiment where two parasitic transistors are used.

The device can be comprised of more than one parasitic bipolar. For example, as shown in top down view in FIG. 1D, multiple parasitic bipolar are used. FIG. 1D is top down view of an aspect of an embodiment where more than one parasitic Tx is used.

The circuit protect can be modified to protect against both positive and negative voltages to the I/O pad.

Gate Options

Referring to FIGS. 1A and 1B, the ESD device can comprise a first gate (G1) over the p-well between the n-well and the n-doped region (N1); a second gate (G2) over the p-well between the n-doped region (N1) and the p-doped region; and a third gate (G3) over the p-well between the p-doped region (P1) and the n− well (NW1).

Gates (e.g., G1 G2 G3) can be used to prevent ST1 formation. In a standard process the STI is formed before the gates. The gates G1 G2 G3 ensure that the n1 and p1 are separated by minimum gate length and not be STI. Thus current can flow laterally instead of around the STI regions.

The poly gates can be used to improve current distribution during ESD and to bias P− substrate to improve ESD device turn-on during as ESD event. The ESD device will work without poly gate but performance (current carrying capacity in an ESD event) may be inferior to the option with the poly gates.

Triggered Circuit Comprised of Back-to-Back Diodes

Figure 2:
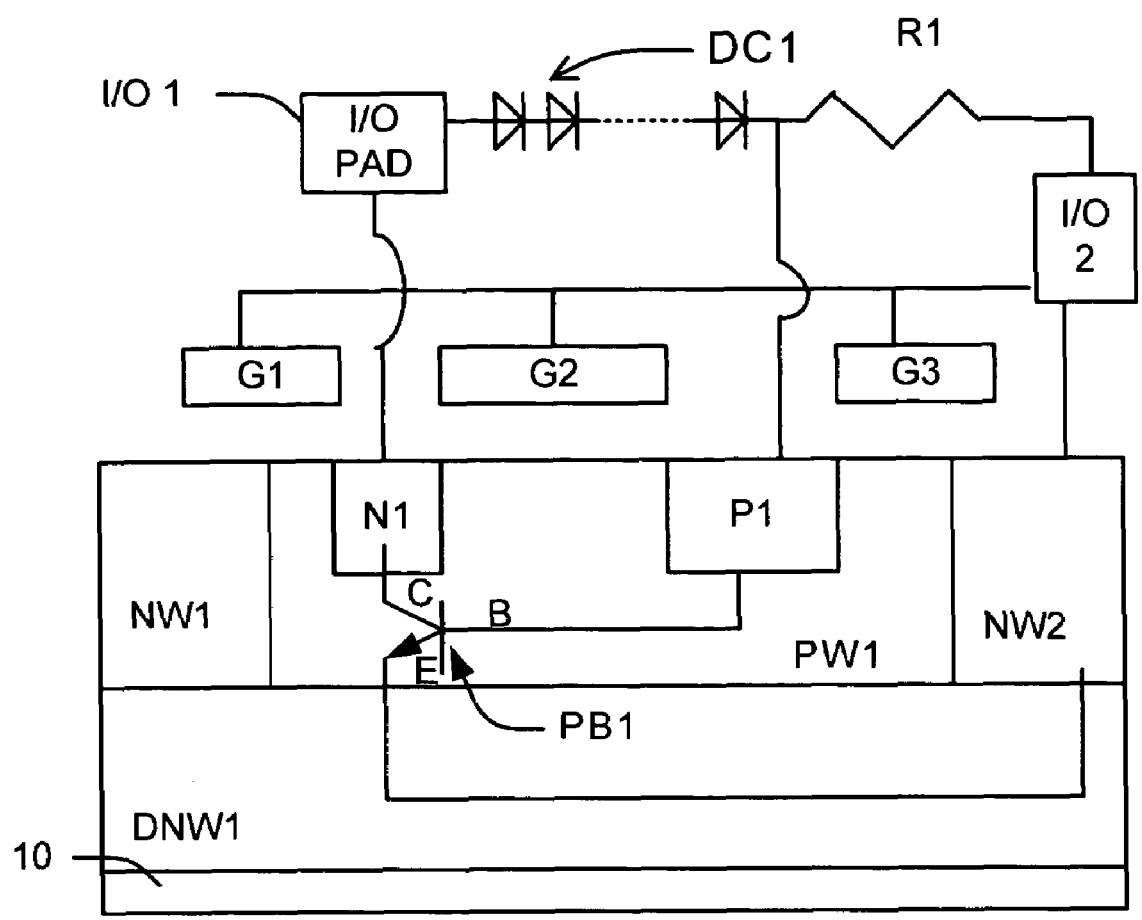
FIG. 2 is a cross sectional view a ESD device where the trigger circuit is comprised of a chain of diodes (DC1) according to an embodiment of the invention.

Referring to FIG. 2, an embodiment is shown where the trigger circuit is comprised of a chain of diodes (DC1).

A chain of diodes (DC1) terminated by a series resistance (R1) can be used as trigger circuit. Resistor (R1) grounds the P− well under normal operating condition but biases the P− well (PSW1) positive and turns on the parasitic bipolar (PB1)(N+/P− well/Deep p-well) during an ESD event.

RC Trigger Circuit

Figure 3:
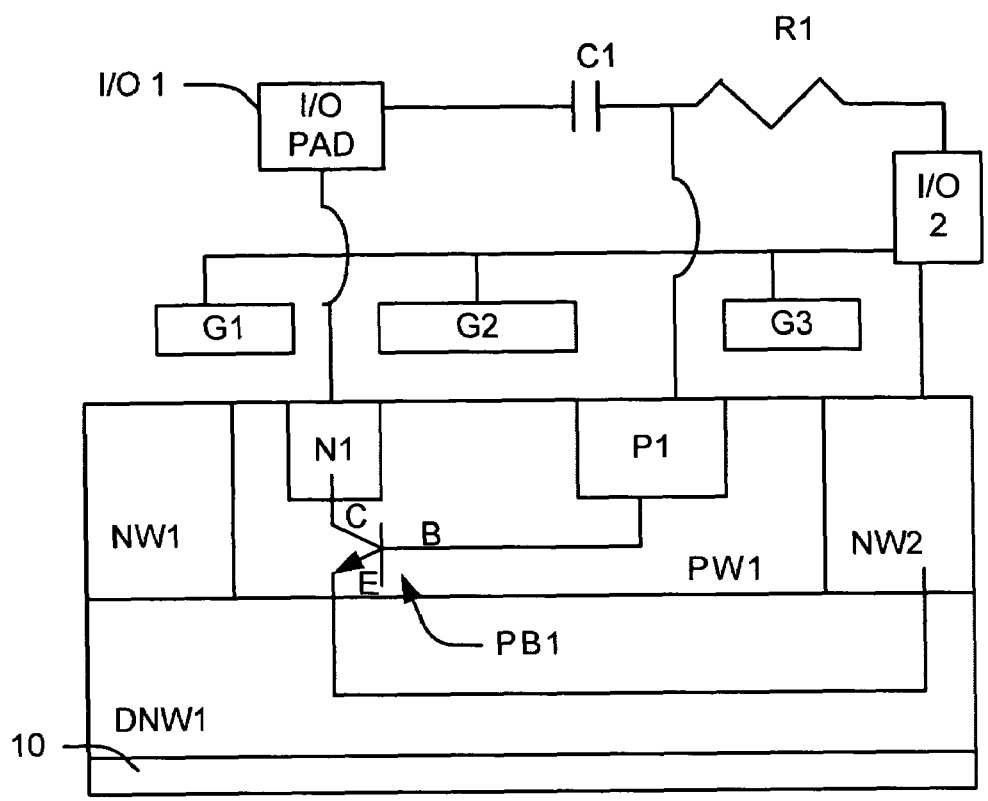
FIG. 3 is a cross sectional view a ESD device where the trigger circuit is comprised of a RC (resistance capacitance) network.

Referring to FIG. 3, an embodiment is shown where the trigger circuit is comprised of a RC (resistance capacitance) network (C1 R1). The RC network is preferably comprised of a diode (DC1) connected to a resistor and the p-doped region (P1). The resistor (R1) is connected to the power supply (Vdd OR GROUND).

An RC network can be used for a trigger circuit. Resistor R1 keeps P− well (PW1) grounded. During an ESD event C1 acts as an AC short and couples the ESD voltage to Resistance R and biases the P− well (PW1) positive and turns on the bipolar device (PB1) formed by N+/pwell/Deep p-well. The RC time constant should be set to about 10 times (about 1.5 to 2 micro seconds) the duration of Human body model (HBM) ESD waveform (100 to 200 nano-seconds).

The embodiment's RC trigger circuit in combination with the vertical parasitic BJT (PB1) is more complex to design than a diode chain, but provides better leakage at high temperatures.

Grounded-Gate NMOS (GGNMOS) Trigger Circuit.

Figure 4:
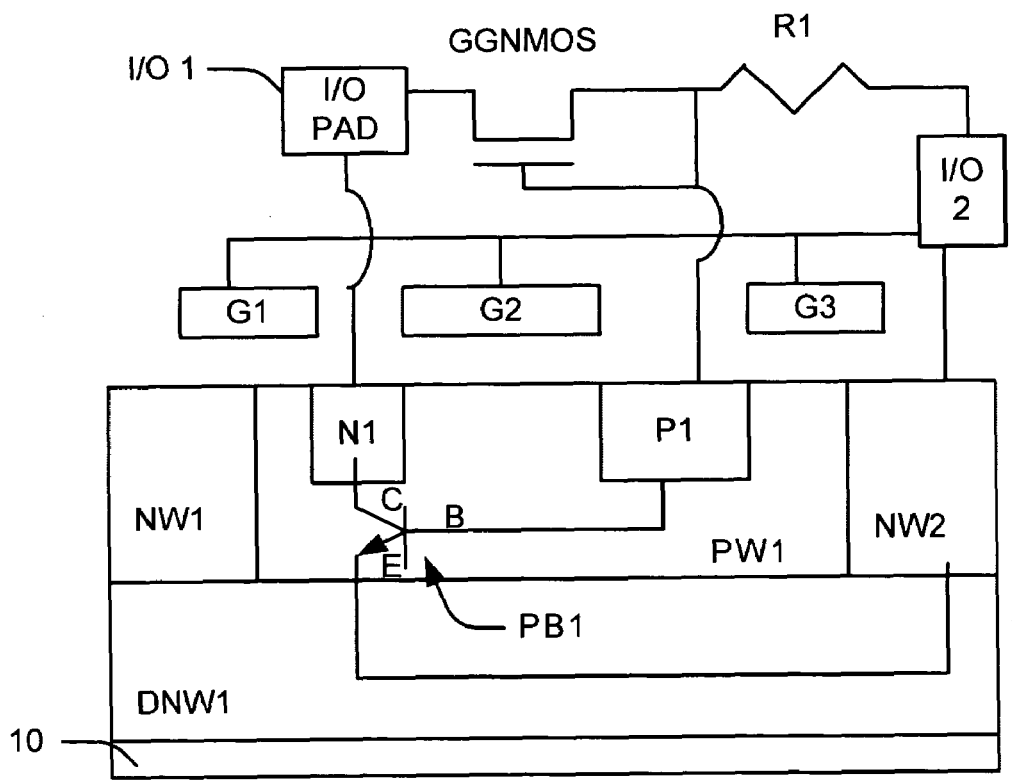
FIG. 4 is a cross sectional view a ESD device where the trigger circuit is comprised of a grounded-gate NMOS transistor (GGNMOS).

Referring to FIG. 4, an embodiment is shown where the Trigger Circuit is comprised of a grounded-gate NMOS transistor (GGNMOS). Also, a resistor (R1) is connected to the grounded-gate NMOS transistor and to the power supply (Vdd).

Resistor (R1) keeps The P− well (PW1) grounded. During an ESD event the GGNMOS turns on and biases the P− well (PW1) through the resistor (R1) and bipolar device (PB1) formed by N+/Pwell/Deep p-well turns on. The GGNMOS Tx can be located in the same P− well tub.

Figure 5:
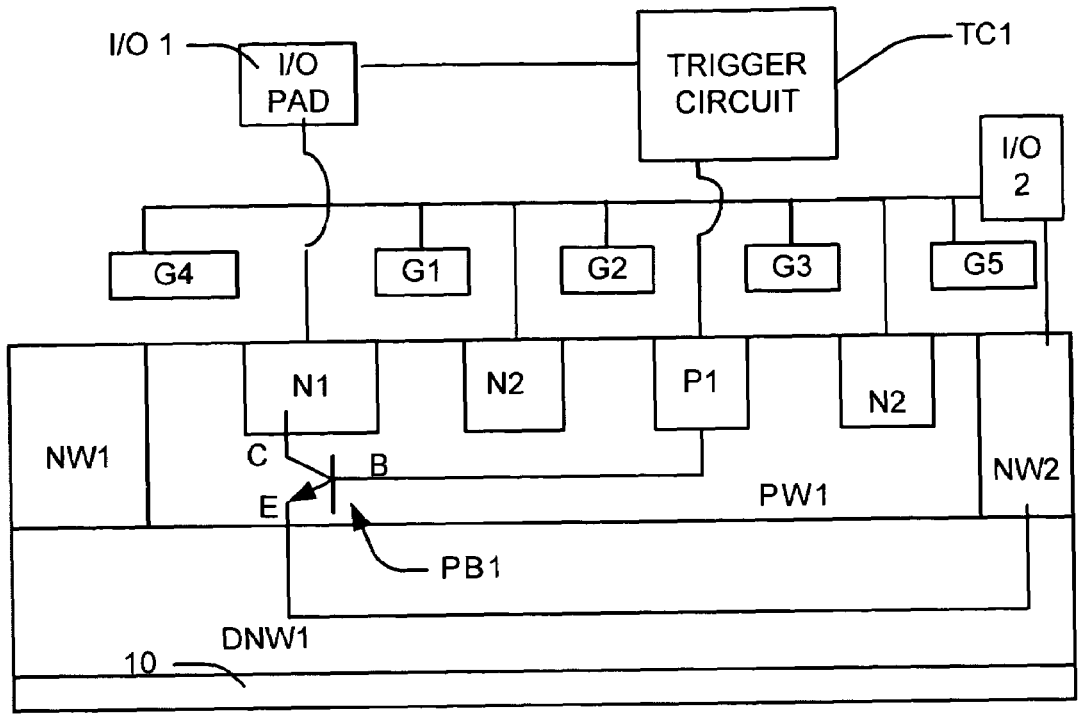
FIG. 5 is a cross sectional view a ESD device where the ESD protection device further includes a N-doped ring region (N2) laterally surrounding the p-doped region (P1).

Embodiment Comprised of Triggered Back-to-Back Diodes with N+ Region Surrounding P+ Region As shown in FIG. 5, an embodiment is shown where the ESD protection device further includes a N-doped ring region (N2) laterally surrounding the p-doped region (P1). Whereby the N-doped ring region and the deep n-well (DNW1) increase the resistance of the parasitic bipolar transistor (PB1) thereby increasing the pinch off during an ESD event.

Additional improvement is possible by taking advantage of the limited depth of the P− well region (PW1). In this aspect, it is proposed to add N+ rings (N2) surrounding the P− region (P1) in the P− well to be able to pinch off the area around P+ region (P1).

Figure 6:
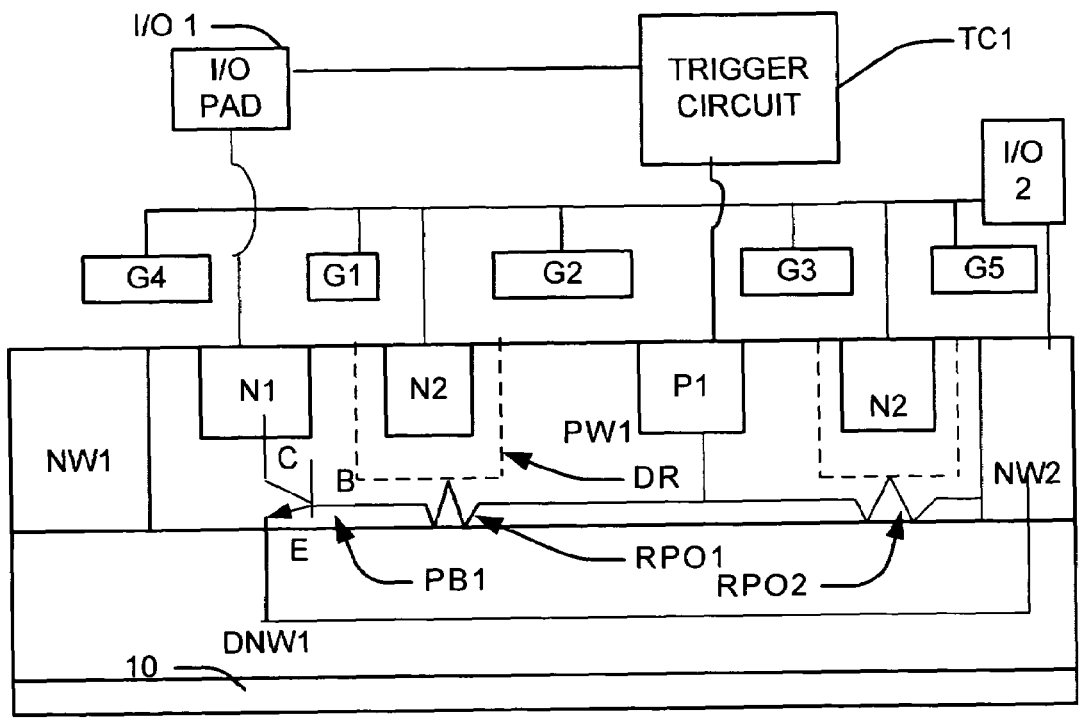
FIG. 6 is a cross sectional view a ESD device where the ESD protection device further includes a N-doped ring region (N2) laterally surrounding the p-doped region (P1). The n-doped ring can be reversed biased to increase resistance.

As shown in FIG. 6, the extension of depletion region (DR) by reverse-biased N+ region during ESD event increases the effective resistance (RPO1) (RPO2) seen by the injected current in the P+ region (P1) by the trigger circuit into P− well region. Thus potential around the P+ region (P1) increases more quickly turning on the bipolar Tx (PB1) formed by N+/Pwell/Deep p-well and device. The N+ region make the PW1 more resistive by pinch-off raising base potential more quickly.

As shown in FIG. 6, the step used to form the ESD device can be the same steps to form NMOS devices in NMOS areas on the chip and PMOS devices on PMOS areas of the chip. For example, N1, G1 and N2 form a NMOS TX with a channel between the n– regions (N1 N2).

Opposite Type ESD Device

The opposite type ESD device can be formed by reversing the conductivity type, but this may not be too practical. The ESD device can be made in the opposite conductivity type regions (e.g., all N regions changed to P and all p regions changed to N). The conductivity types of wells and doped layers may be opposite to those employed in the above embodiments. In this case, the connections to the input/output pad I/O and the ground terminal may be exchanged.

Method to Form an ESD Device

An embodiment of a method of forming an ESD protection device comprising the following (See FIGS. 1A and 1B).

We form a n-doped region (N1) and a p-doped region (P1) in a p-well (PW1) in a semiconductor structure 10. The n-doped region (N1) and a p-doped region (P1) are spaced.

We form a n-well (NW1 NW2) and a deep n– well (DNW1) surrounding the p-well (PW1) on the sides and bottom.

We connect electrically a first I/O pad (I/O1) to the n-doped region (N1).

We connect electrically a trigger circuit (TC1) the first I/O pad (I/O1) and the p-doped region (P1).

We connect electrically a second I/O pad (I/O 2) the n-well.

A (vertical) parasitic bipolar transistor (PB1) is preferably comprised of the n-doped region (N1) functioning as a collector terminal, the P– well (PW1) functioning as a base terminal, and the deep p-well (DNW1) functioning as the emitter terminal. Whereby under an ESD condition, the p-well (PW1) is charged positive using the trigger circuit (TC1) and the parasitic bipolar transistor (PB1) can be turned on.

In another embodiment, we form a first gate over the p-well between the n-doped region and the p-doped region; and form a second gate over the p-well between the p-doped region and the n-well. We electrically connect the first gate, the second gate and second I/O pad.

Non-Limiting Embodiments

In the above description numerous specific details are set forth in order to provide a more thorough understanding of the present invention. It will be obvious, however, to one skilled in the art that the present invention may be practiced without these details. In other instances, well known process have not been described in detail in order to not unnecessarily obscure the present invention.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A ESD protection device comprising:
   a) a n-doped region and a p-doped region in a p-well in a semiconductor structure; said n– doped region and said p-doped region are spaced;
   b) a n-well and a deep n-well surrounding said p-well on the sides and bottom;
   c) a first I/O pad connected to said n-doped region;
   d) a trigger circuit connected to said first I/O pad and said p-doped region;
   e) a second I/O pad connected to said n-well;
   f) a parasitic bipolar transistor is comprised of the n-doped region functioning as a collector terminal, the P– well functioning as a base terminal, and the deep p-well functioning as the emitter terminal; whereby under an ESD condition, the p-well is charged positive using the trigger circuit and said parasitic bipolar transistor can be turned on.

2. The ESD protection device of claim 1 which further comprises:
   a first gate over said p-well between said n-doped region and said p-doped region; and
   a second gate over said p-well between said p-doped region and said n-well.

3. The ESD protection device of claim 1 which further comprises:
   a first gate over said p-well between said n-doped region and said p-doped region; and
   a second gate over said p-well between said p-doped region and said n-well;
   said second I/O pad connected to said first gate and said second gate.

4. The ESD protection device of claim 1 which further comprises said n-doped region and said p-doped region are separated by an isolation region.

5. The ESD protection device of claim 1 wherein said trigger circuit comprises a chain of diodes.

6. The ESD protection device of claim 1 wherein said trigger circuit comprises a RC network comprised of a diode connected to a resistor and said p-doped region; said resistor connected to said second I/O pad.

7. The ESD protection device of claim 1 wherein said trigger circuit comprises a RC network comprised of a diode connected to a resistor and said p-doped region; said resistor connected to said second I/O pad; said RC network has a RC time constant about 10 times the duration of human body model ESD waveform.

8. The ESD protection device of claim 1 wherein said trigger circuit comprises a RC network comprised of a diode connected to a resistor and said p-doped region said resistor connected to said second I/O pad; said RC network has a RC time constant between about 1.5 and 2 micro seconds.

9. The ESD protection device of claim 1 wherein said trigger circuit comprises a grounded-gate nMOS transistor and a resistor connected to the grounded-sate nMOS transistor and to said second I/O pad.

10. The ESD protection device of claim 1 which further includes a N-doped ring region laterally surrounding said p-doped region whereby said N-doped ring region and said deep n-well increase the resistance of the parasitic bipolar transistor thereby increasing the pinch off during an ESD event.

11. The ESD protection device of claim 1 wherein said semiconductor structure is comprised of silicon.

12. The ESD protection device of claim 1 which further includes contacts to said n-doped and said p-doped regions; said contacts are comprised of a silicide.

13. The ESD protection device of claim 1 wherein said ESD protection device is further comprised of a second parasitic bipolar transistor.

14. A method of forming an ESD protection device comprising:
   a) forming a n-doped region and a p-doped region in a p-well in a semiconductor structure; said n-doped region and said p-doped region are spaced;
   b) forming a n-well and a deep n-well that surround said p-well on the sides and bottom;
   c) connecting electrically a first I/O pad to said n-doped region;
   d) connecting electrically a trigger circuit to said first I/O and said p-doped region;
   e) connecting electrically a second I/O pad to said n-well; whereby a parasitic bipolar transistor is comprised of the n-doped region functioning as a collector terminal, the P– well functioning as a base terminal, and the deep p-well functioning as the emitter terminal; whereby under an ESD condition, the p-well is charged positive using the trigger circuit and the parasitic bipolar transistor can be turned on.

15. The method of claim 14 which further comprises;
   forming a first gate over said p-well between said n-doped region and said p-doped region; and
   forming a second gate over said p-well between said p-doped region and said n-well;
   electrically connecting said first gate, said second gate and second I/O pad.

16. The method of claim 14 which further comprises:
   forming a first gate over said p-well between said n-doped region and said p– doped region; and
   forming a second gate over said p-well between said p-doped region and said n-well.

17. The method of claim 14 which further includes forming isolation regions separating said n-doped region and p-doped region.

18. The method of claim 14 wherein said trigger circuit is formed by forming a chain of diodes.

19. The method of claim 14 which further includes forming said trigger circuit by forming a RC network comprised of a diode connected to a resistor and said p-doped region; said resistor connected to said second I/O pad.

20. The method of claim 14 which further includes forming said trigger circuit by fanning a RC network comprised of a diode connected to a resistor and said p-doped region; said resistor connected to said second I/O pad; said RC network has a RC time constant about 10 times the duration of Human body model ESD waveform.

21. The method of claim 14 which further includes forming said trigger circuit by forming a RC network comprised of a diode connected to a resistor and said p-doped region; said resistor connected to said second I/O pad; said RC network has a RC time constant between about 1.5 and 2 micro seconds.

22. The method of claim 14 which further includes forming said trigger circuit by forming a grounded-gate nMOS transistor and a resistor connected to the grounded-gate nMOS transistor and to the second I/O pad.

23. The method of claim 14 which further includes forming a N-doped ring region laterally surrounding said p-doped region whereby said N-doped ring region and said deep n-well increase the resistance of the parasitic bipolar transistor thereby increasing the pinch off during an ESD event.

24. The method of claim 14 wherein said semiconductor structures comprised of silicon.

25. The method of claim 14 which further includes forming contacts comprised of a silicide to the n-doped regions and said p-doped regions.

26. A method for using an ESD protection device comprising the steps of:
   (1) providing:
      a) a n-doped region and a p-doped region in a p-well in a semiconductor structure; said n– doped region and said p-doped region are spaced;
      b) a n-well and a deep n-well surrounding said p-well on the sides and bottom;
      c) a first I/O pad connected to said n-doped region;
      d) a trigger circuit connected to said first I/O pad and said p-doped region;
      e) a second I/O pad connected to said n-well;
      f) a parasitic bipolar transistor is comprised of the n-doped region functioning as a collector terminal, the P– well functioning as a base terminal, and the deep p-well functioning as the emitter terminal;
   (2) charging said p-well using the trigger circuit under an ESD condition and turning on said parasitic bipolar transistor.

27. The method of claim 26 which further comprises:
   forming a first gate over said p-well between said n-doped region and said p– doped region; and
   forming a second gate over said p-well between said p-doped region and said n-well.

28. The method of claim 26 which further comprises;
   forming a first gate over said p-well between said n-doped region and said p– doped region; and
   forming a second gate over said p-well between said p-doped region and said n-well;
   connecting said second I/O pad to said first gate and said second gate.

29. The method of claim 26 wherein said trigger circuit is comprised of a chain of diodes.

30. The method of claim 26 wherein said trigger circuit comprises a RC network comprised of a diode connected to a resistor and said p-doped region; said resistor connected to said second I/O pad.

31. The method of claim 26 wherein said trigger circuit comprises a grounded-gate nMOS transistor and a resistor connected to the grounded-gate nMOS transistor and to said second I/O pad.

32. The method of claim 26 which further includes forming a N-doped ring region laterally surrounding said p-doped region whereby said N-doped ring region and said deep n-well increase the resistance of the parasitic bipolar transistor thereby increasing the pinch off during an ESD event.

33. A method of using a ESD protection device comprising the steps of:
   (1) providing:
      a) a n-doped region and a p-doped region in a p-well in a semiconductor structure; said n– doped region and said p-doped region are spaced;
      b) a n-well and a deep n-well surrounding said p-well on the sides and bottom;
      c) a first I/O pad connected to said n-doped region;
      d) a trigger circuit connected to said first I/O pad and said p-doped region;
      e) a second I/O pad connected to said n-well;

f) a parasitic bipolar transistor is comprised of the n-doped region functioning as a collector terminal, the P– well functioning as a base terminal, and the deep p-well functioning as the emitter terminal; whereby under an ESD condition, the p-well is charged positive using the trigger circuit and said parasitic bipolar transistor can be turned on;

g) a N-doped ring region laterally surrounding said p-doped region whereby said N-doped ring region and said deep n-well increase the resistance of the parasitic bipolar transistor thereby increasing the pinch off during an ESD event (2) reverse-biasing said N-doped ring region during an ESD event to increase the effective resistance seen by the injected current in the P-doped region by said trigger circuit into p-well.

* * * * *

UNITED STATES PATENT AND TRADEMARK OFFICE
CERTIFICATE OF CORRECTION

PATENT NO. : 7,064,358 B2  Page 1 of 1
APPLICATION NO. : 10/743596
DATED : June 20, 2006
INVENTOR(S) : Indrajlt Manna et al.

It is certified that error appears in the above-identified patent and that said Letters Patent is hereby corrected as shown below:

Col. 8, line 15, please replace "p-well" with -- N-well -- before "functioning".

Col. 8, line 53, add -- ; -- after "a resistor and said p-doped region".

Col. 8, line 58, please replace "grounded-sate" with -- grounded-gate -- before "nMOS".

Col. 9, line 16, please add -- pad -- after "first I/O".

Col. 9, line 22, please replace "p-well" with -- N-well -- after "the deep".

Col. 9, line 50, please replace "fanning" with -- forming -- before "a RC network".

Col. 10, line 24, please replace "p-well" with -- N-well -- before "functioning".

Col. 11, line 4, please replace "p-well" with -- N-well -- before "functioning".

Signed and Sealed this

Second Day of January, 2007

JON W. DUDAS
*Director of the United States Patent and Trademark Office*